(12) United States Patent
Rangarajan et al.

(10) Patent No.: US 10,751,738 B2
(45) Date of Patent: Aug. 25, 2020

(54) SPRAY BAR DESIGN FOR UNIFORM LIQUID FLOW DISTRIBUTION ON A SUBSTRATE

(71) Applicant: Applied Materials, Inc., Santa Clara, CA (US)

(72) Inventors: Jagan Rangarajan, San Jose, CA (US); Gee Sun Hoey, San Jose, CA (US); Jaimie Stomberg, Fremont, CA (US); Ekaterina Mikhaylichenko, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 341 days.

(21) Appl. No.: 15/857,272

(22) Filed: Dec. 28, 2017

(65) Prior Publication Data

US 2018/0185857 A1    Jul. 5, 2018

Related U.S. Application Data

(60) Provisional application No. 62/441,049, filed on Dec. 30, 2016.

(51) Int. Cl.
| | | |
|---|---|---|
| *B05B 1/20* | (2006.01) | |
| *B05B 13/02* | (2006.01) | |
| *H01L 21/67* | (2006.01) | |
| *B08B 3/02* | (2006.01) | |
| *B08B 1/00* | (2006.01) | |
| *B05B 7/08* | (2006.01) | |
| *B05B 15/68* | (2018.01) | |

(52) U.S. Cl.
CPC .............. *B05B 1/20* (2013.01); *B05B 7/0846* (2013.01); *B05B 7/0884* (2013.01); *B05B 13/0278* (2013.01); *B05B 15/68* (2018.02); *B08B 1/002* (2013.01); *B08B 3/02* (2013.01); *H01L 21/67046* (2013.01); *H01L 21/67051* (2013.01); *B05B 13/0228* (2013.01)

(58) Field of Classification Search
CPC ....................................................... B05B 1/20
See application file for complete search history.

(56) References Cited

U.S. PATENT DOCUMENTS

| | | |
|---|---|---|
| 5,746,234 A | 5/1998 | Jones |
| 6,910,240 B1 | 6/2005 | Boyd et al. |
| 8,458,843 B2 | 6/2013 | Ko et al. |
| 2007/0163627 A1 | 7/2007 | Lim et al. |
| 2008/0295868 A1 | 12/2008 | Nakamura et al. |

(Continued)

FOREIGN PATENT DOCUMENTS

| | | |
|---|---|---|
| KR | 20080099625 A | 11/2008 |
| WO | 2014172613 A1 | 10/2014 |

OTHER PUBLICATIONS

International Search Report and Written Opinion for Application No. PCT/US2017/068264 dated May 15, 2018.

*Primary Examiner* — Jason Y Ko
(74) *Attorney, Agent, or Firm* — Patterson + Sheridan LLP (57) ABSTRACT

A spray manifold for a brush box is disclosed which includes an elongated body having a plurality of holes formed in a line along a direction parallel to a longitudinal axis of the body, a linear slot formed along a length of the body aligning with the line of the holes, a central bore formed along the length of the body and between each of the holes and the slot, and a cover disposed on the slot.

20 Claims, 6 Drawing Sheets

(56) References Cited

U.S. PATENT DOCUMENTS

2011/0031326 A1   2/2011  Sato
2013/0111678 A1   5/2013  Chen et al.
2015/0140818 A1*  5/2015  Lee .................... B24B 37/34
                                                  438/692

* cited by examiner

SPRAY BAR DESIGN FOR UNIFORM LIQUID FLOW DISTRIBUTION ON A SUBSTRATE

CROSS-REFERENCE TO RELATED PATENT APPLICATION

This application claims benefit of U.S. Provisional Patent Application Ser. No 62/441,049, filed Dec. 30, 2016, which is hereby incorporated herein by reference.

BACKGROUND

Field

The present application relates to semiconductor device manufacturing and is more particularly related to systems and methods for cleaning substrates.

Description of the Related Art

As semiconductor device geometries continue to decrease, the importance of ultra clean processing of substrates also increases. Aqueous cleaning and scrubbing within a brush box after chemical mechanical polishing (CMP) may be employed. However, any streaking, spotting and residue present after cleaning can cause subsequent device failure. Accordingly, much attention has been directed to improved methods for cleaning a substrate after CMP processing.

Current brush box modules utilize a spray bar with up to about five nozzles for delivering HF/Chemistry to a front side and a back side of a substrate. This approach has proved to have limitations due to poor uniformity of spray on a substrate. For example, spray from conventional nozzles within conventional spray bars only deliver fluid to discrete spots on substrate and have poor uniformity. In addition, conventional nozzles need higher back pressure than available to create a fully developed and/or a desirable spray pattern, which leads to poor oxide etch rate uniformity on the substrate with distinct peaks and valleys. Further, combinations of available off the shelf nozzles do not provide enough resolution and flexibility for uniform chemical coverage.

Therefore, there exists a need for an apparatus and method that optimizes spray applications onto a substrate that may reduce or minimize the formation of cleaning related defects and film delamination during processing.

SUMMARY

In one embodiment, a spray manifold for a brush box is disclosed which includes an elongated body having a plurality of holes formed in a line along a length of the body, a linear slot formed along the length of the body aligning with the line of the holes, a central bore formed along the length of the body and between each of the holes and the slot, and a cover disposed on the slot.

In another embodiment, a spray manifold for a brush box is disclosed. The spray manifold includes a spray bar comprising an elongated body having a plurality of holes formed in a line along a longitudinal axis of the body, wherein each of the plurality of holes includes a first opening having a first diameter and a second opening aligned with the first opening and having a second diameter that is different than the first diameter, a linear slot formed along the longitudinal axis of the body and aligning with the line of the holes, a central bore formed along the length of the body and between each of the holes and the slot, and a weld closing the slot.

In another embodiment, a brush box for processing a substrate is disclosed which includes a first brush and a second brush that are positioned to clean a substrate positioned in a processing region of the brush box, wherein the first brush is positioned to clean a front surface of the substrate and the second brush is positioned to clean a backside surface of the substrate, and a first spray bar and a second spray bar that are positioned to deliver a cleaning fluid to the substrate positioned in the processing region of the brush box, wherein the first spray bar is positioned to deliver a cleaning fluid to the front surface of the substrate and the second spray bar is positioned to deliver a cleaning fluid to the backside surface of the substrate. Each of the first spray bar and the second spray bar comprise an elongated body having a plurality of holes formed in a line along a length of the body, a linear slot formed along the length of the body aligning with the line of the holes, a central bore formed along the length of the body and between each of the holes and the slot, and a cover disposed on the slot.

BRIEF DESCRIPTION OF THE DRAWINGS

So that the manner in which the above recited aspects of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In general, aspects of the disclosure provide methods and apparatus for cleaning substrates having conductive materials and dielectric films disposed thereon. The disclosure will be described below in reference to a cleaning process for the removal of slurry and particles formed on a surface of a substrate during a chemical mechanical polishing (CMP) process. Chemical mechanical polishing is broadly defined herein as polishing a substrate by a combination of both chemical and mechanical activity. The cleaning process can performed in or immediately after being processed in a chemical mechanical polishing process equipment, such as the MIRRA® polishing system, the MIRRA® Mesa™ polishing system, the Reflexion™ polishing system, or the Reflexion™ LK Prime polishing system, all of which are available from Applied Materials, Inc.

Figure 1A:
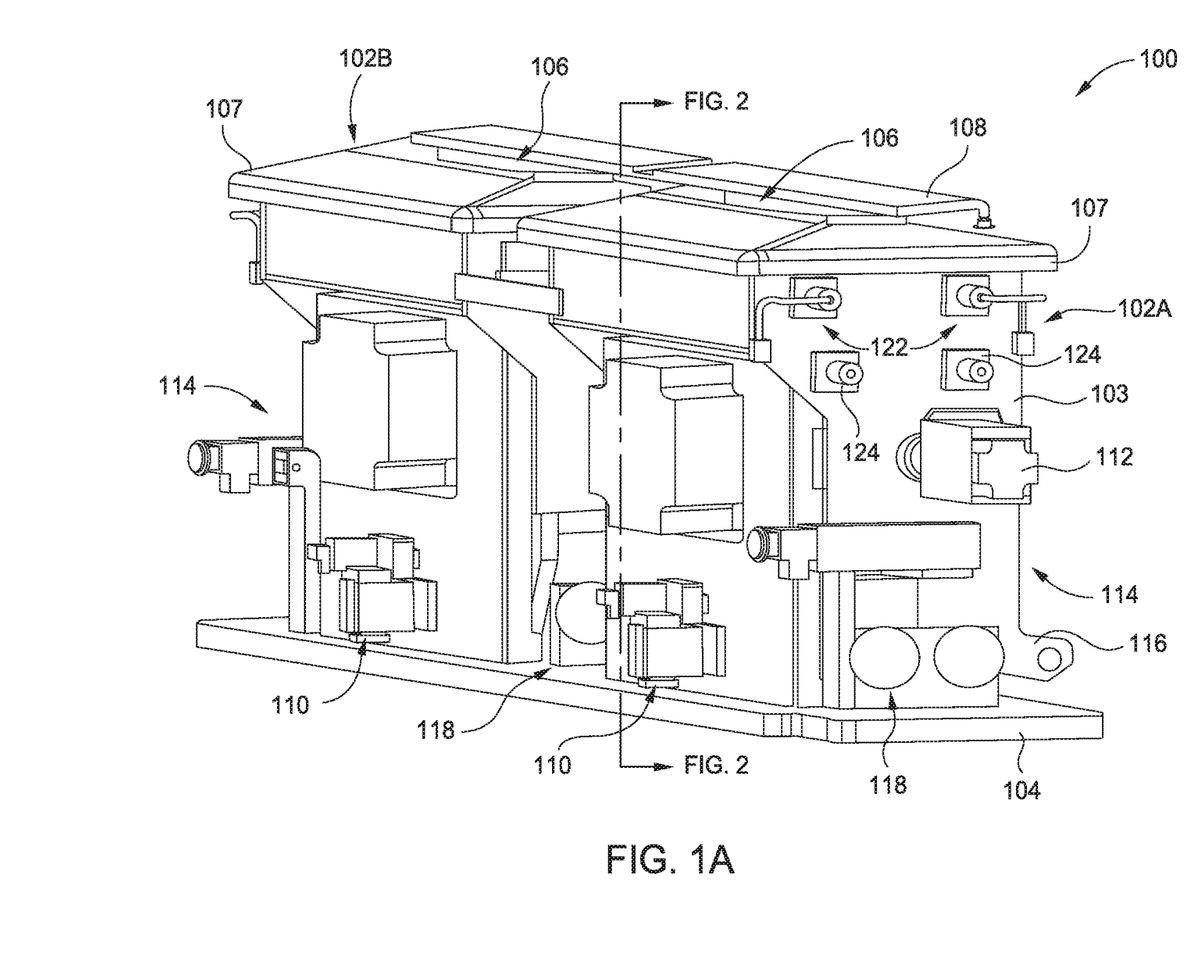
FIG. 1A is a schematic perspective view of a brush box assembly in accordance with one embodiment of the disclosure.
Figure 1B:
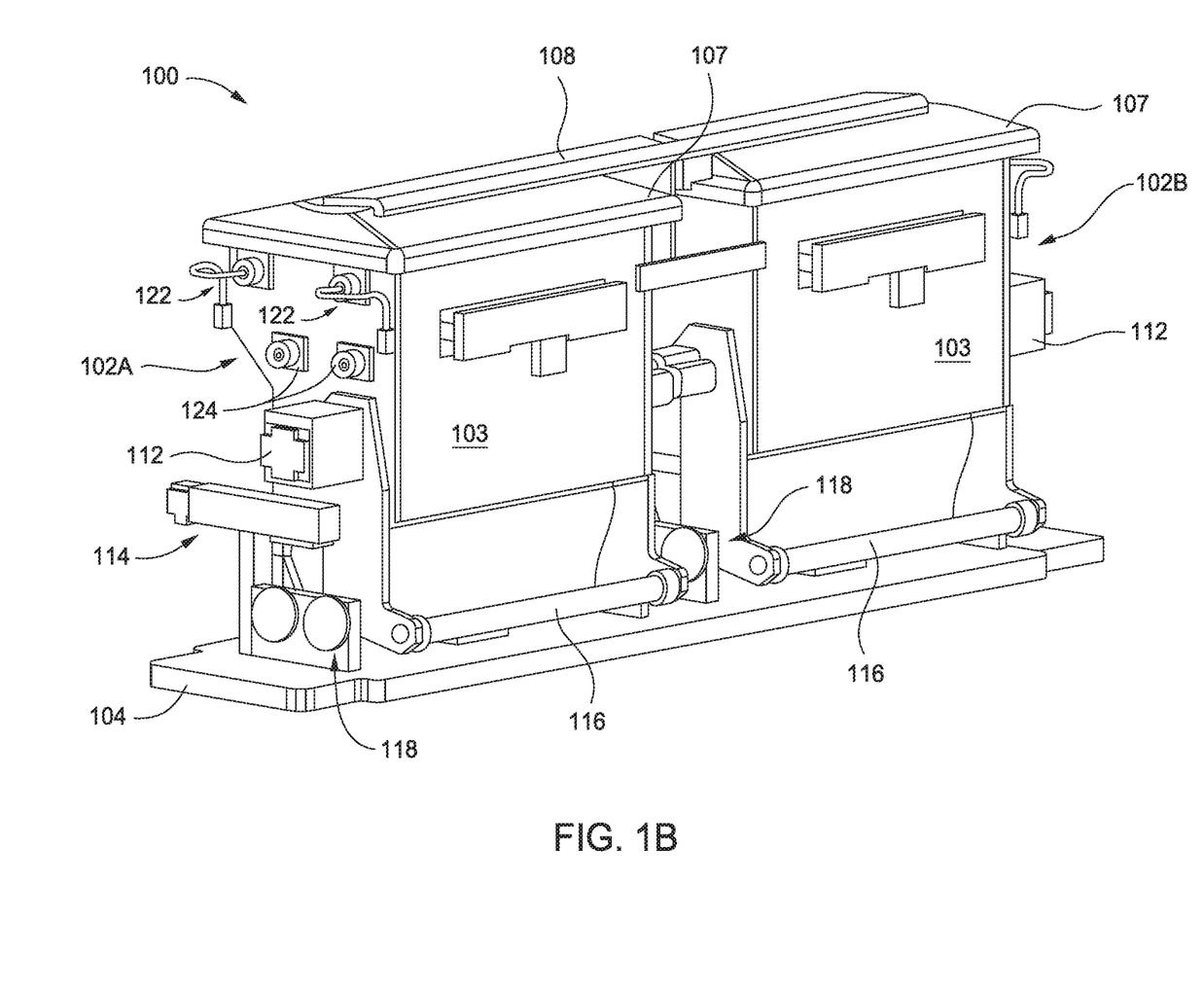
FIG. 1B is a schematic perspective view of a backside of the brush box assembly shown in FIG. 1A.

FIG. 1A is a schematic perspective view of a brush box assembly 100 in accordance with one embodiment of the disclosure. FIG. 1B is a schematic perspective view of a backside of the brush box assembly 100 shown in FIG. 1A. The common features are shown in FIG. 1B are the same as shown in FIG. 1A and will not be repeated for brevity.

The brush box assembly 100 comprises two brush box modules 102A, 102B secured to a supporting base 104. Each of the brush box modules 102A, 102B include a chamber body 103 that encloses a cleaning chamber where a substrate is processed. Each brush box module 102A, 102B is configured to receive a substrate in a vertical orientation from a robot (not shown). The brush box assembly 100 or one or more of the brush box modules 102A, 102B may be used in a system configured to clean multiple substrates simultaneously.

Each of the brush box modules 102A, 102B include an opening 106 formed in a lid 107. The opening 106 is configured to allow passage of a substrate into the cleaning chamber contained inside the chamber body 103. During processing, the openings 106 may be closed by a cover 108 to prevent cleaning solution from splashing out of the cleaning chambers and to prevent outside particles from entering the cleaning chambers. A single cover 108 is configured to close the openings 106 of both brush box modules 102A, 102B. An actuator (not shown) is coupled to the cover 108 and is configured to facilitate opening and closing of the cover 108.

Each of the brush box modules 102A, 102B may be a substantially identical to each other and some common devices may be shown in one view while others are hidden. Common devices disposed on each of the brush box modules 102A, 102B include a drive system 110 that is coupled to a substrate support (not shown in FIG. 1A) for holding a substrate during processing, an actuator 112 for rotating a scrub brush during processing, and an actuator assembly 114 for controlling force of the scrub brush against the substrate. The actuator assembly 114 operates in conjunction with a mounting frame 116 that supports opposing ends of a scrub brush (not shown in FIG. 1A). The mounting frame 116 is movably coupled to the base 104 by a pivot bearing assembly 118, which allows the mounting frame 116 to pivot relative to the chamber body 103. Each of the brush box modules 102A, 102B also include fluid ports 122 and 124, both of which will be explained in greater detail below.

Figure 2:
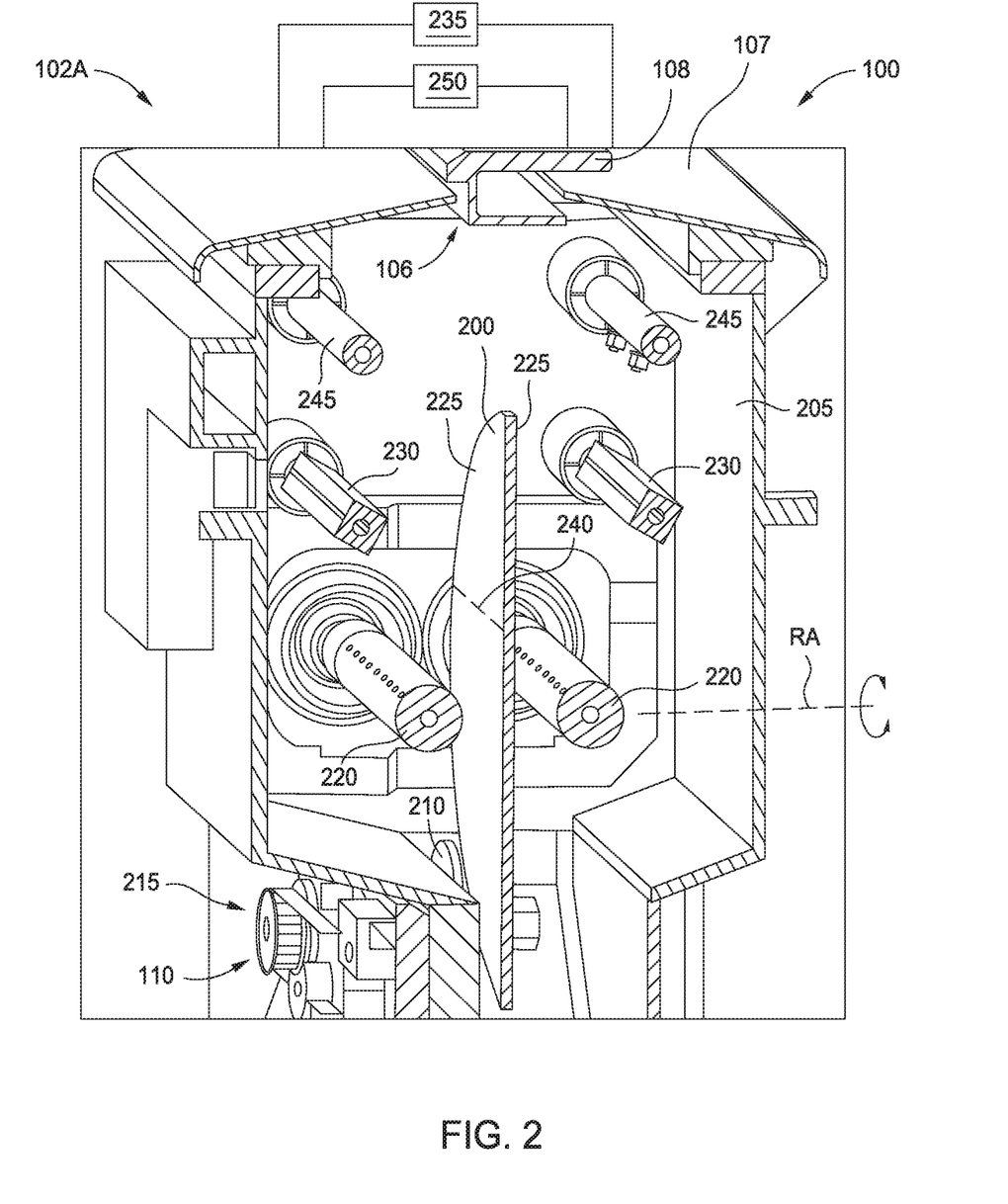
FIG. 2 is an isometric cross-sectional view of the brush box module along line 2-2 of FIG. 1A.

FIG. 2 is an isometric cross-sectional view of the brush box module 102A along line 2-2 of FIG. 1A. A substrate 200 is shown in cross-section within an interior volume 205 (e.g., the cleaning chamber mentioned above) of the brush box module 102A. The substrate 200 is supported by at least two rollers 210 (only one is shown). At least one of the rollers 210 may be coupled to a drive motor 215 (e.g., the drive system 110) to rotate the substrate 200 about a rotation axis RA.

As the substrate 200 is rotated about the rotation axis RA, scrub brushes 220 are actuated toward major surfaces 225 of the substrate 200. While the substrate 200 is rotated about the rotation axis RA, scrub brushes 220 rotate in a rotational axis that is substantially orthogonal to the rotation axis RA. In addition, spray bars 230, which are coupled to an etch chemical source 235 via the fluid ports 124 (shown in FIGS. 1A and 1B), provide a uniform spray pattern across a line 240 (only a portion is shown on one side of the substrate 200 in dashed lines) of the substrate 200. The line 240 may correspond to a diameter or a chord of the substrate 200. The etch chemical source 235 includes cleaning chemicals, such as acids, for example hydrofluoric acid (HF). The spray pattern provided by the spray bars 230 may be a fan shape or a linear pattern such that chemicals from the chemical source 235 impinge the substrate predominately at the line 240. The line 240 may be at or near the diameter of the substrate 200. Drying spray bars 245 may be positioned adjacent to the spray bars 230. The drying spray bars 245 are coupled to a drying chemical source 250 via the fluid ports 122 (shown in FIGS. 1A and 1B). The drying chemical source may include isopropyl alcohol (IPA), among other drying fluids.

Figures 3A, 3H, 3I:
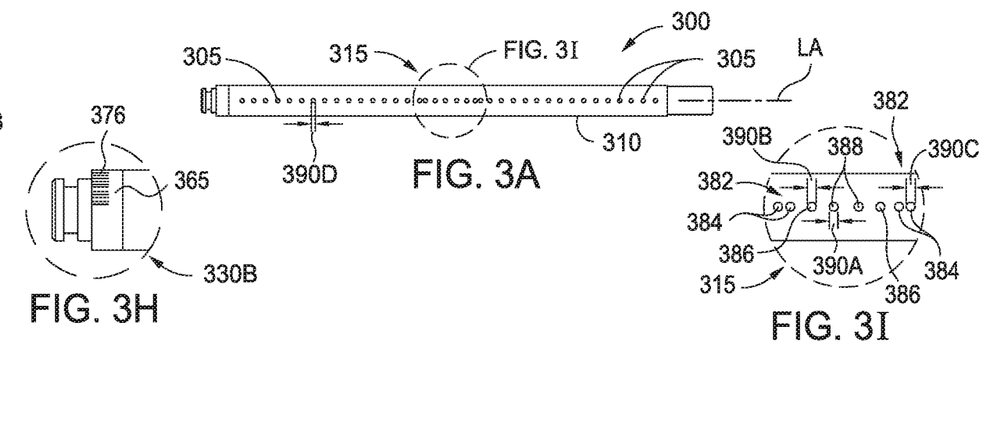
FIGS. 3A-3I are various views of one embodiment of a spray manifold that may be utilized as the spray bars of FIG. 2.
Figures 3B, 3C, 3D, 3E, 3G:
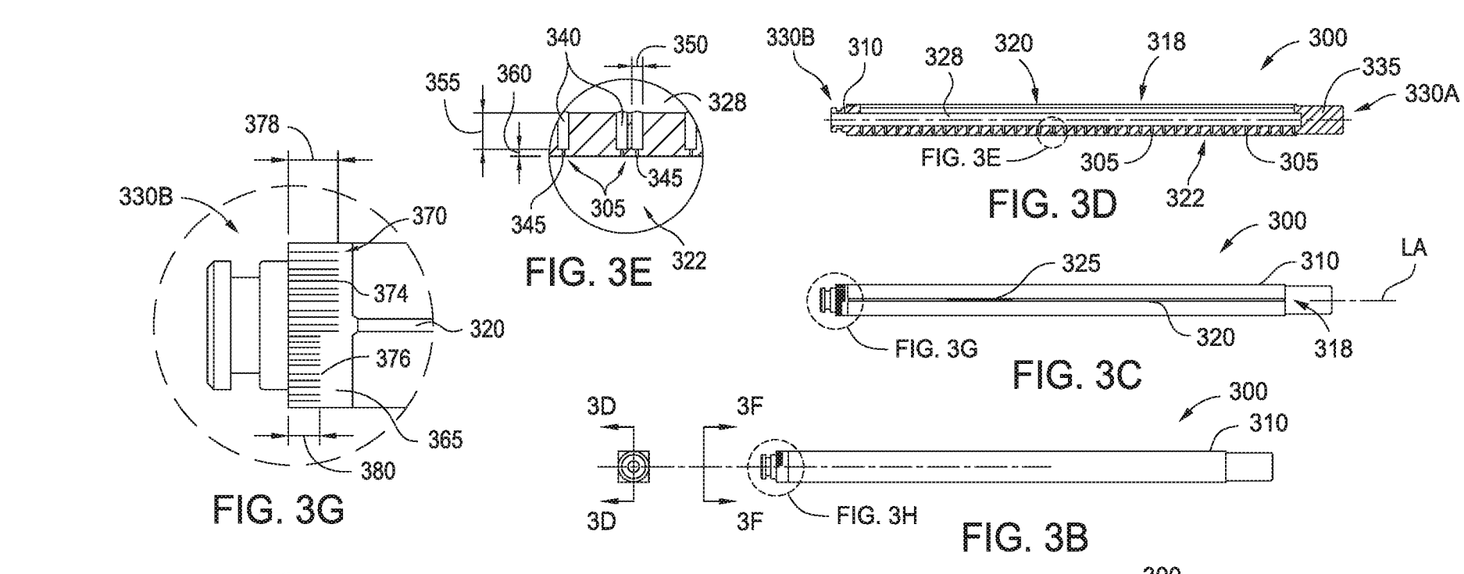

FIGS. 3A-3I are various views of one embodiment of a spray manifold 300 that may be utilized as the spray bars 230 of FIG. 2. FIG. 3A is a side view of the spray manifold 300 showing a front side (e.g., the side facing the line 240 of FIG. 2). FIG. 3B is a side view of the spray manifold 300 rotated about 90 degrees from the view shown in FIG. 3A. FIG. 3C is a side view of the spray manifold 300 rotated about 180 degrees from the view shown in FIG. 3A. FIG. 3D is a sectional view of the spray manifold 300 along lines 3D-3D of FIG. 3B.

As shown in FIG. 3A, a plurality of holes 305 is shown on the spray manifold 300. In one embodiment, the spray manifold 300 has about 40 holes 305. The holes 305 are formed through a tubular body 310 of the spray manifold 300. The tubular body is fabricated from a plastic material, such as a fluoropolymer material, for example, polyvinylidene fluoride or polyvinylidene difluoride (PVDF). The holes 305 may be positioned on the tubular body 310 along the same line, for example, a line parallel to a longitudinal axis LA of the tubular body 310. Sizes of the holes 305 and/or a pitch between holes 305 may be the same or different along the line parallel to the longitudinal axis LA. For example, a central portion 315 of the tubular body 310 may include holes 305 that are spaced differently and/or have a different size than the pitch and/or size of the remainder of the plurality of holes 305. The central portion 315 will be explained in more detail in FIG. 3I.

Referring to FIG. 3C, a back side 318 of the spray manifold 300 is shown. A slot 320 is shown positioned on the back side 318 parallel to the longitudinal axis LA. A portion of a cover 325 is shown at least partially filling the slot 320 in FIG. 3C. While a portion of the cover 325 is shown in FIG. 3C, the cover 325 would extend along the length of the slot 320 in order to seal the entirety of the slot 320. Sealing of the slot 320 using the cover 325 contains fluids within the tubular body 310 and this permits flow of fluids through the openings 305 (as well as through other flow elements) formed therein. The cover 325 may be a weld. The cover 325 may be the same material as the tubular body 310. The back side 318 is opposite to a front side 322 of the tubular body 310.

Referring to FIG. 3D, the tubular body 310 is shown in cross-section such that the geometry of the plurality of holes 305 are shown. A central bore 328 is shown with the tubular body 310. The tubular body 310 includes a first end 330A and a second end 330B opposing the first end 330A. The central bore 328 may be open on the second end 330B and extend to and/or terminate adjacent to the first end 330A. The tubular body 310 may be partially circular and partially rectangular. The rectangular portion includes a major dimension (shown in FIG. 3F). The first end 330A includes a reduced diameter portion 335. The reduced diameter portion 335 includes a circular body having a diameter that is less than the major dimension of the tubular body 310. For example, the reduced diameter portion 335 may have a diameter that is about 2 millimeters (mm) less than a major dimension of the tubular body 310.

FIG. 3E is an enlarged view of a portion of the spray manifold 300 shown in FIG. 3D. Each of the plurality of holes 305 include a first opening 340 that is fluidly coupled to a second opening 345. A diameter 350 of each of the first openings 340 may be about 1.5 mm to about 2 mm. A diameter of the second openings 345 are less than the diameter 350 of the first openings 340. Additionally, the diameters of the second openings 345 may be varied while the diameter 350 of the first openings 340 is the same. Lengths or depths of the first openings 340 may be similar with respect to a surface of the central bore 328. For example, a length 355 of the first openings 340 may be about 5 mm. Similarly, lengths of the second openings 345 may be similar with respect to a surface of the central bore 328. For example, a length 360 of the second openings 345 may be about 1 mm. The lengths and diameters of the first openings 340 may be determined to supply an ample volume of fluid to a substrate.

A width dimension of the slot 320 may be greater than diameters of the first openings 340. The slot 320 may be utilized to form one or both of the first openings 340 and the second openings 345 of the plurality of holes 305 by drilling or machining. Additionally, the slot 320 may be utilized to clean and/or deburr the plurality of openings 305 after formation thereof. Thereafter, the cover 325 may be coupled to the tubular body 310 to contain fluids within the tubular body 310.

Figure 3F:
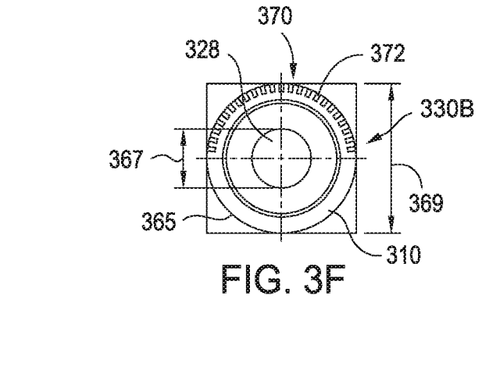

FIG. 3F is a side view of the second end 330B of the spray manifold 300 along line 3F-3F of FIG. 3B. The central bore 328 is shown in the tubular body 310. The tubular body 310 also includes an outer surface 365 that circumscribes the central bore 328. A diameter 367 of the central bore 328 may be about 6 mm to about 10 mm. A major dimension 369 of the outer surface 365 may be about 18 mm to about 22 mm.

Additionally, the tubular body 310 includes a plurality of indexing features 370 disposed about a portion of the outer surface 365. The indexing features 370 may be utilized as a portion of an interface with the brush box module 102A of FIG. 2 that establishes a reference angle of the spray bars 230 relative to the substrate 200. Each of the indexing features 370 may be in the form of a depression or channel 372 formed in the outer surface 365 of the tubular body 310. The indexing features 370 may be positioned on about one-half of the outer surface 365 (e.g., less than about 180 degrees of the outer surface 365).

FIG. 3G and FIG. 3H are enlarged views of the second end 330B of the spray manifold 300. The indexing features 370 are shown as first channels 374 and second channels 376. The second channels 376 have a length that is less than a length of the first channels 374. The second channels 376 may be used as a spray bar angle marker. The length of the second channels 376 is shorter so personnel may determine which direction to rotate the spray manifold 300.

FIG. 3I is an enlarged view of the spray manifold 300 of FIG. 3A. The plurality of holes 305 includes a central zone 315 where two closely-spaced pairs of holes 382 surround other holes of the central zone 315. Each of the pairs of closely-spaced holes 382 include two outer holes 384 that have a pitch therebetween that is less than a pitch of the remainder of the plurality of holes 305 of the spray manifold 300. The spacing of the pair of closely-spaced holes 382 may also be seen in FIG. 3E.

Each of the pair of closely-spaced holes 382 surround two intermediate holes 386, which surround two central holes 388. Diameters of the outer holes 384, the intermediate holes 386, and the central holes 388 may be different from each other and/or different from the remainder of the plurality of holes 305. A diameter of the central holes 388 is greater than a diameter of the intermediate holes 386. The diameter of the intermediate holes 386 is greater than a diameter of the outer holes 384. The diameter of the outer holes 384 is greater than a diameter of the remainder of the plurality of holes 305. For example, the central holes 388 may include a diameter 390A of about 0.50 mm to about 0.54 mm. The intermediate holes 386 may include a diameter 390B of about 0.39 mm to about 0.43 mm. The outer holes 384 may include a diameter 390C of about 0.27 mm to about 0.31 mm. The remainder of the plurality of holes 305 may include a diameter 390D of about 0.22 mm to about 0.27 mm. The spacing and/or size of the holes in the central zone 315 relative to the size and/or spacing of the remainder of the plurality of holes 305 provide a higher density of holes in the center of the spray manifold 300. The greater density provides a greater volume of cleaning fluids to a central portion of the substrate 200. The different sizes of the holes in the central zone 315 are provided to have greater flow in the center of the spray manifold 300. For example, the three pairs of different size holes in the central zone 315, all having diameters greater than the remainder of the plurality of holes 305, provide more fluid flow in the central zone 315. The outermost of the outer holes 384 may serve to transition from the larger diameter holes of the central zone 315 to the remainder of the plurality of holes 305 outside of the central zone 315.

Figure 4:
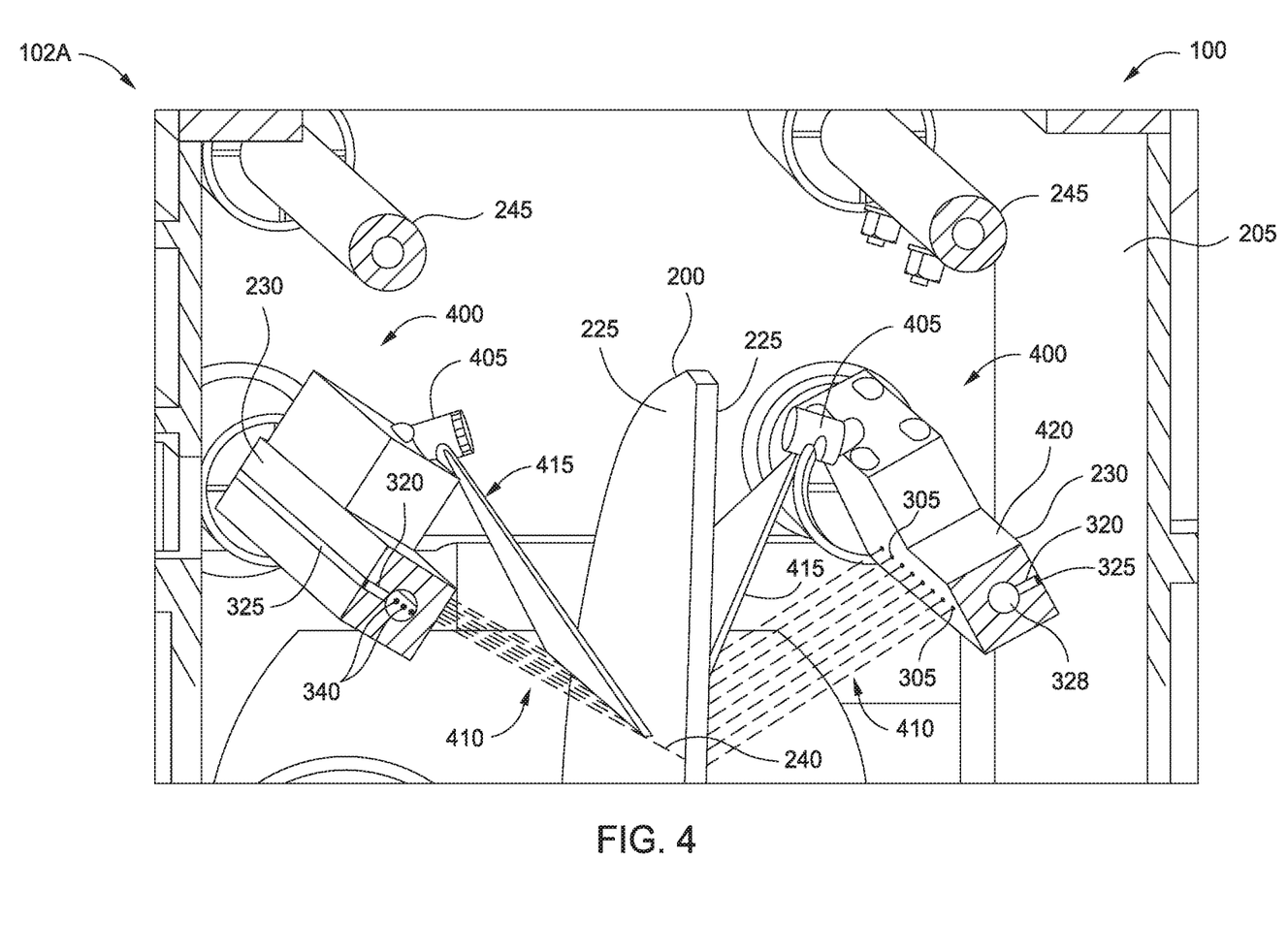
FIG. 4 is a schematic view of a portion of the interior volume of the brush box module showing another embodiment of a spray manifold.

FIG. 4 is a schematic view of a portion of the interior volume 205 of the brush box module 102A showing another embodiment of a spray manifold 400. While some portions of the brush box module 102A are shown in FIG. 4, other portions of the brush box module 102A shown in FIG. 2 are not shown in FIG. 4.

The spray manifold 400 according to this embodiment includes the spray bars 230 and a pair of jet nozzles 405 mounted adjacent to each of the spray bars 230. Each of the spray bars 230 include a spray pattern, such as a first spray pattern 410 and each of the jet nozzles 405 include a spray pattern, such as a second spray pattern 415. The second spray pattern 415 may be a fan-shaped pattern. Both of the first spray pattern 410 and the second spray pattern 415 deliver cleaning chemistry to the major surfaces 225 of the substrate 200 during processing. The first spray pattern 410 and the second spray pattern 415 may be adjusted to impinge the substrate 200 at the line 240, for example, at the same location on the major surfaces 225 of the substrate 200. In this embodiment, the jet nozzles 405 are located at a different plane than a plane of the plurality of holes 305 of the spray bars 230. For example, the jet nozzles 405 may be positioned on an upper surface 420 of each of the spray bars 230.

The spray manifold 400 according to this embodiment may provide more flow of cleaning chemicals to the major surfaces 225 of the substrate 200. The greater flow may provide a smoother etch rate as compared to conventional cleaning processes. Further, one or both of the jet nozzles 405 may be tuned to impinge only a portion of the line 240. For example, the jet nozzles 405 may be adjusted to provide the second spray pattern 415 to about one-third of the diameter of the substrate 200, or less, such as about one-quarter of the diameter of the substrate 200.

Figure 5:
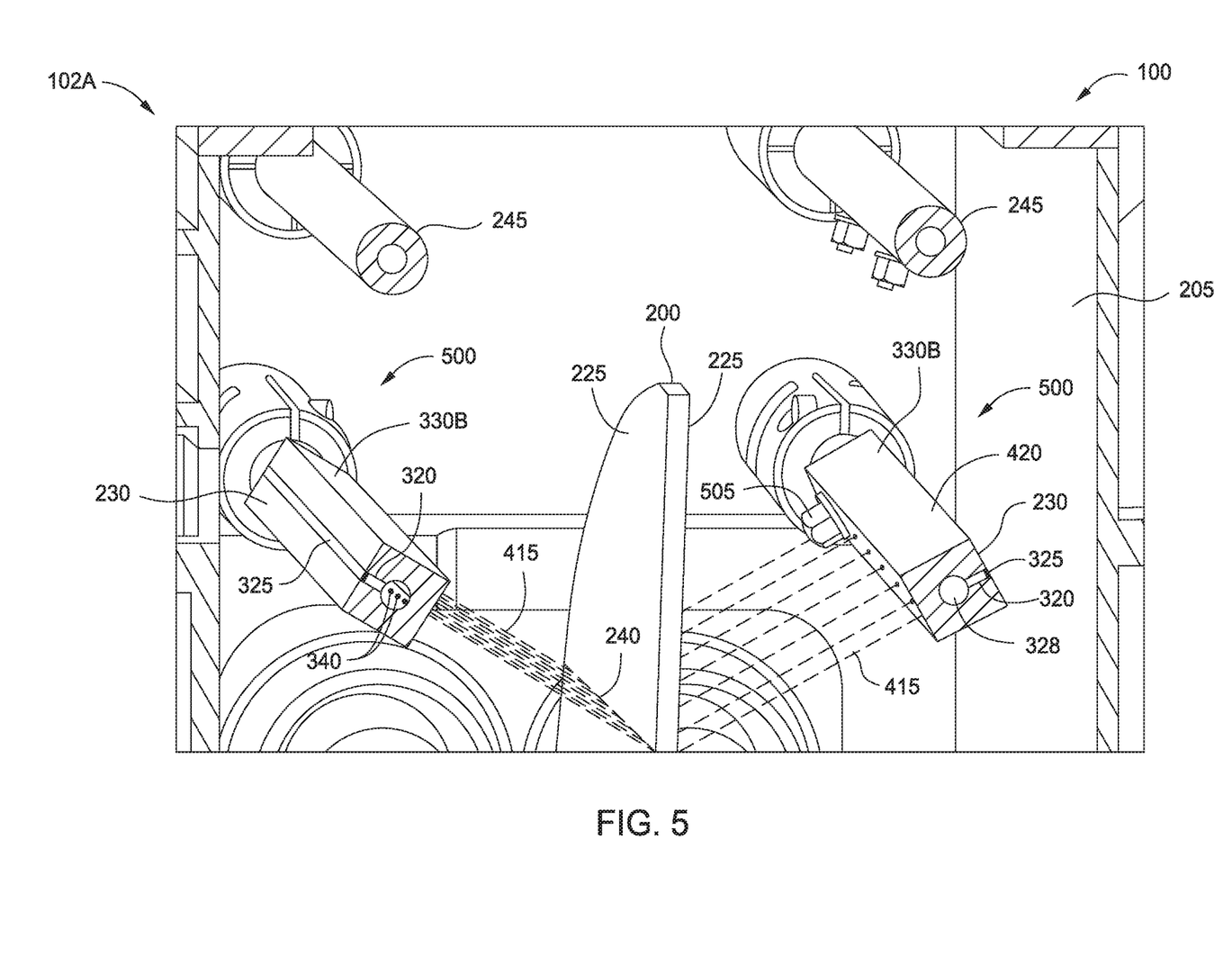
FIG. 5 is a schematic view of a portion of the interior volume of the brush box module showing another embodiment of a spray manifold.

FIG. 5 is a schematic view of a portion of the interior volume 205 of the brush box module 102A showing another embodiment of a spray manifold 500. While some portions of the brush box module 102A are shown in FIG. 5, other portions of the brush box module 102A shown in FIG. 2 are not shown in FIG. 5.

The spray manifold 500 according to this embodiment includes the spray bars 230 and a pair of jet nozzles 505 incorporated with each of the spray bars 230 (only one spray nozzle is shown in the view of FIG. 5). For example, instead of mounting the jet nozzles on the upper surface 420 of the spray bars 230 as shown in FIG. 4, the jet nozzles 505 are positioned in the same plane as the plurality of holes 305 of the spray bars 230. Similar to FIG. 4, each of the spray bars 230 include the first spray pattern 410 (not shown in FIG. 5 for clarity) and each of the jet nozzles 505 include the second spray pattern 415. Both of the first spray pattern 410 and the second spray pattern 415 deliver cleaning chemistry to the major surfaces 225 of the substrate 200 during processing. Similar to FIG. 4, the first spray pattern 410 and the second spray pattern 415 may be adjusted to impinge the substrate 200 at the line 240 (e.g., at the same location on the major surfaces 225 of the substrate 200).

Each of the jet nozzles 505 may be positioned at second ends 330B of the spray bars 230 as shown. However, a first ends 330A of the spray bars 230 (not shown in FIG. 5) may also include a jet nozzles 505. The jet nozzles 505 according to this embodiment may replace one or more of the plurality of holes 305 of each of the spray bars 230.

The spray manifold 500 according to this embodiment may provide more flow of cleaning chemicals to the major surfaces 225 of the substrate 200. The greater flow may provide a smoother etch rate as compared to conventional cleaning processes. One or both of the jet nozzles 505 may be tuned to impinge only a portion of the line 240 (e.g., at the edge region of the substrate 200). For example, the jet nozzles 505 may be adjusted to provide the second spray pattern 415 to about one-third of the diameter of the substrate 200, or less, such as about one-quarter of the diameter of the substrate 200.

While the foregoing is directed to embodiments of the present disclosure, other and further embodiments of the disclosure may be devised without departing from the basic scope thereof, and the scope thereof is determined by the claims that follow.

What is claimed is:

1. A spray manifold for a brush box, the spray manifold comprising:
   an elongated tubular body having a first side with a plurality of holes formed in the first side in a line along a direction parallel to a longitudinal axis of the tubular body;
   a linear slot formed along a length of the tubular body in a second side of the tubular body that aligns with the line of the holes;
   a central bore formed along the length of the tubular body and between each of the holes and the slot; and
   a cover at least partially disposed in the slot.

2. The spray manifold of claim 1, wherein the cover comprises a weld.

3. The spray manifold of claim 1, wherein each of the plurality of holes includes a first opening having a first diameter and a second opening aligned with the first opening and having a second diameter that is different than the first diameter.

4. The spray manifold of claim 3, wherein the first diameter is greater than the second diameter.

5. The spray manifold of claim 3, wherein the slot includes a width dimension that is greater than each of the first and second diameters.

6. The spray manifold of claim 1, wherein the tubular body includes a central zone, and a spacing and/or size of the holes in the central zone are different than a size and/or spacing of the plurality of holes located outside of the central zone.

7. The spray manifold of claim 6, wherein the central zone includes a pair of closely-spaced holes having a pitch that is less than a pitch of the plurality of holes located outside of the central zone.

8. The spray manifold of claim 7, wherein the central zone includes a plurality of central holes and a plurality of intermediate holes disposed between the central holes and the closely-spaced holes.

9. The spray manifold of claim 8, wherein a diameter of the central holes is greater than a diameter of the intermediate holes.

10. The spray manifold of claim 9, wherein the diameter of the intermediate holes is greater than a diameter of the closely-spaced holes.

11. The spray manifold of claim 10, wherein the diameter of the closely-spaced holes is greater than a diameter of the remainder of the plurality of holes.

12. A spray manifold for a brush box, the spray manifold comprising:
    a spray bar comprising an elongated tubular body having a plurality of holes formed in a line along a longitudinal axis of the tubular body, wherein each of the plurality of holes includes a first opening having a first diameter and a second opening aligned with the first opening and having a second diameter that is different than the first diameter;
    a linear slot formed along the longitudinal axis of the tubular body along a side of the tubular body opposite to, and aligning with, the line of the holes;
    a central bore formed along a length of the tubular body and between each of the holes and the slot; and
    a cover sealing the slot.

13. The spray manifold of claim 12, wherein each of the plurality of holes includes a first opening having a first diameter and a second opening aligned with the first opening and having a second diameter that is less than the first diameter.

14. The spray manifold of claim 12, further comprising a jet nozzle associated with the spray bar.

15. The spray manifold of claim 14, wherein the jet nozzle is positioned on an upper surface of the spray bar.

16. The spray manifold of claim 14, wherein the jet nozzle is positioned in a plane of each of the plurality of holes of the spray bar.

17. A brush box for processing a substrate, comprising:
    a first brush and a second brush that are positioned to clean a substrate positioned in a processing region of the brush box, wherein the first brush is positioned to clean a front surface of the substrate and the second brush is positioned to clean a backside surface of the substrate; and
    a first spray bar and a second spray bar that are positioned to deliver a cleaning fluid to the substrate positioned in the processing region of the brush box, wherein the first spray bar is positioned to deliver a cleaning fluid to the front surface of the substrate and the second spray bar is positioned to deliver a cleaning fluid to the backside surface of the substrate, and the first spray bar and the second spray bar each comprise:
- an elongated tubular body having a plurality of holes formed in a line along a direction parallel to a longitudinal axis of the tubular body;
- a linear slot formed along a length of the tubular body along a side of the tubular body opposing the holes and aligning with the line of the holes;
- a central bore formed along the length of the tubular body and between each of the holes and the slot; and
- a cover at least partially disposed in the slot.

18. The brush box of claim 17, further comprising a jet nozzle associated with the spray bar.

19. The brush box of claim 18, wherein the jet nozzle is positioned on an upper surface of the spray bar.

20. The brush box of claim 18, wherein the jet nozzle is positioned in a plane of each of the plurality of holes of the spray bar.

\* \* \* \* \*